(12) United States Patent
Furukawa et al.

(10) Patent No.: US 7,083,739 B2
(45) Date of Patent: Aug. 1, 2006

(54) TRANSFER BODY AND METHOD USING THE SAME

(75) Inventors: Tadahiro Furukawa, Tokyo (JP); Hisashi Sato, Tokyo (JP); Ichiro Bekku, Tokyo (JP); Kazumi Arai, Tokyo (JP)

(73) Assignee: Kyodo Printing Co., Ltd., Tokyo (JP)

( * ) Notice: Subject to any disclaimer, the term of this patent is extended or adjusted under 35 U.S.C. 154(b) by 265 days.

(21) Appl. No.: 10/677,912

(22) Filed: Oct. 2, 2003

(65) Prior Publication Data
US 2004/0065404 A1    Apr. 8, 2004

Related U.S. Application Data

(62) Division of application No. 09/670,095, filed on Sep. 26, 2000, now Pat. No. 6,673,426.

(30) Foreign Application Priority Data
Sep. 28, 1999    (JP)    ............................... 11-275199

(51) Int. Cl.
*B44C 1/22*    (2006.01)
(52) U.S. Cl. ............................ 216/33; 216/36; 216/67; 156/230; 438/213

(58) Field of Classification Search .................. 216/33, 216/36, 67; 156/230; 428/213
See application file for complete search history.

(56) References Cited

U.S. PATENT DOCUMENTS

| | | | | |
|---|---|---|---|---|
| 5,246,804 | A | * | 9/1993 | Furukawa et al. ............ 430/20 |
| 5,322,832 | A | * | 6/1994 | Takeyama et al. ........... 503/227 |
| 6,194,348 | B1 | * | 2/2001 | Onishi et al. ................ 503/227 |
| 6,287,672 | B1 | * | 9/2001 | Fields et al. ................. 428/209 |

FOREIGN PATENT DOCUMENTS

JP    11-024081    *    1/1999

* cited by examiner

*Primary Examiner*—Shamim Ahmed
(74) *Attorney, Agent, or Firm*—Frommer Lawrence & Haug LLP; Ronald R. Santucci (57) ABSTRACT

There is disclosed a transfer body including at least a peelable layer, a transparent conductive layer and an adhesive layer all sequentially laminated on a supporting body, wherein the supporting body has a heat resisting property enough to withstand heat treatment to the layers on the supporting body and a large rigidity compared with an opponent member to which the layers are to be transferred, and wherein the peelable layer is formed to have a pull strength of 100 g/cm or more.

11 Claims, 6 Drawing Sheets

Moving Direction of Roll ⟹

TRANSFER BODY AND METHOD USING THE SAME

CROSS-REFERENCE TO RELATED APPLICATION

This application is a division of U.S. Ser. No. 09/670,095, now U.S. Pat. No. 6,673,426 filed Sep. 26, 2000 entitled "Transfer Body and Method Using the Same" which claims priority benefits of Japanese Patent Application 11-275199 filed Sep. 28, 1999 for which a certified copy of this priority Japanese application document was filed in the parent application.

BACKGROUND OF THE INVENTION

A method for manufacturing a laminated body has heretofore been known, in which a transparent conductive layer peelably laminated on a temporary supporting body is transferred to a transparent substrate composed of plastic material through an adhesive agent, thereby producing a laminated body including the transparent substrate and the transparent conductive layer. Such a transparent conductive layer is typically composed of an indium tin oxide (ITO).

For example, Japanese Patent Application Laid-Open No. S60-231396 discloses a transfer type laminated body in which an ITO layer is peelably formed on a temporary supporting body. This Laid-Open further discloses a method in which an ITO layer is vapor-deposited on a supporting body composed of a Teflon film, thereafter, the vapor-deposited ITO layer is subjected to heat treatment in an oven at a temperature of 300° C. to decrease the electrical resistance of the ITO layer, and the ITO layer of the transfer type laminated body is transferred to a polymethyl-methacrylate substrate. It also teaches that an aromatic polyimide can be used as the supporting body. Moreover, Japanese Patent Application Laid-Open No. S59-204542 discloses a method in which an ITO layer is vapor-deposited to a heat-resisting substrate which has been subjected to peel-off treatment and thereafter, the ITO layer is transferred to a film through an epoxy resin adhesive agent having a low temperature hardening property.

Japanese Patent Application Laid-Open No. S58-177345 discloses a method in which an ITO layer is sputtered to a mold release treatment surface of a polyester film, and the ITO layer is thermally press-bonded to a polyvinyl butyral sheet so that the ITO layer is transferred to the surface of the polyvinyl butyral sheet.

Japanese Patent Application Laid-Open No. S59-151705 discloses a method in which an ITO vapor-deposited film layer is formed on a temporary carrier such as a Teflon film and a polyimide film and then the ITO layer is transferred to a surface of a plastic transparent substrate through an adhesive agent having a thermo- or photo-hardening property.

Moreover, Japanese Patent Application Laid-Open No. H07-80980 discloses a transparent conductive transfer sheet in which an ITO layer and an adhesive layer are sequentially laminated on a substrate composed of a film having a low surface energy. It also teaches a stretched polypropylene as a specific example of a film having a low surface energy.

On the other hand, Japanese Patent Application Laid-Open No. H02-174011 discloses a method in which a resin coating film is laminated on a temporary supporting body (release sheet), an ITO layer is laminated on the resin coating film and a thermally adherable adhesive agent is laminated on the ITO layer to thereby form a transfer sheet, and the transfer sheet is press bonded to a glass substrate while heating, so that a laminated body composed of the ITO layer and the resin coating film is transferred thereto through the adhesive layer. This Patent Application Laid-Open teaches that a synthetic resin film such as polyethylene, polypropylene, polyester and the like can be used as the supporting body and the a mold releasing treatment is executed, where necessary, with respect to the supporting body. It is also disclosed that a peelable layer functions as a protective film of the ITO layer that as a suitable material thereof, one can be selected from the group consisting of celullosic resins, acrylic resins and nylon resins and that the thickness of the peelable layer is 1.5 μm or less and preferably 1 μm or less.

Furthermore, Japanese Patent Application Laid-Open No. H11-24081 discloses a method in which a laminated body including polyimide resin layer and an ITO layer laminated on a temporary carrier by vapor-deposition, sputtering, pasting or the like is peeled off from the polyimide resin layer and transferred. It also teaches that a film having a heat-resisting property such as kapton, polyetherimide, etc. is used as a supporting body. At that time, the polyimide resin layer is also transferred from the temporary carrier to the transparent substrate and this polyimide resin layer is formed to have a thickness of 100 nm suited to be used as an orientation film.

In the above-mentioned conventional methods, an ITO layer is formed on a heat-resisting plastic film and then transferred to a plastic film or glass substrate through an adhesive agent. Accordingly, no consideration is paid to the variation (expansion and contraction) of the film occurrable at the time of formation of the ITO layer on the plastic film.

Moreover, this adverse effect becomes more manifest as the pattern precision of the ITO layer becomes finer. However, the conventional methods pay no attention to this fact.

For example, in the series of a transfer laminated body and a transfer method discussed in the former method, the ITO layer is laminated directly to the temporary supporting body and no resin layer is disposed together with the ITO layer between the supporting body and the ITO layer. In a constitution like this, it is practically impossible to etch the ITO layer on the supporting body so as to form a pattern. The reason is that since the adhesion between the ITO layer and the underground layer is not good, an etching liquid is liable to permeate into an interface between those layers at the time of an etching treatment to the ITO layer and as a result, the patterned ITO layer is peeled off.

In the latter method, the ITO layer is formed on the plastic film as a supporting body. Accordingly, when the ITO layer is shaped into the form of a pattern in that state, the plastic film is expanded and contracted by thermal expansion and/or temperature at the time of formation of the pattern. This makes it impossible to form an ITO layer with a high degree of precision.

Moreover, since a plastic film is used as the supporting body, another problem is encountered in which a long dimensional accuracy cannot be obtained due to distortion of the film. Particularly, in the case where a color filter is formed on the ITO layer, it is necessary to make a positional alignment between the ITO layer and the color pixels constituting the color filter or between the color pixels. However, if the pattern precision (positional precision) is not good, there is such a vital shortcoming in that the color pixels cannot be provided on the ITO layer correctly.

For example, the thermal expansion coefficient of polyimide (Kapton) as a representative heat-resisting high polymer is about $4 \times 10^{-5}/°$ C. This means that if the temperature is changed 1° C., a film (polyimide) having a length of 30 cm is expanded by 12 µm.

However, it is difficult to control the temperature within a range of 1° C., in the actual manufacturing process. Also, if it is taken into consideration the fact that a space width of the adjacent lines of ITO for a crystal device is normally 10 to 20 µm, there can be encountered with such inconveniences that due to variation of the heat processing temperature at the time of manufacture, a color pixel of the color filter layer is overlapped with a different color pixel or placed astride over different color pixels.

As an example of the change in length dimension due to variation of temperature, one test example is taken up here, in which a film composed of a polyether sulfone resin was used. Only by dipping this film in water for cleaning, the length of 30 cm was elongated 150 µm. This film was treated at 100° C. for drying and the temperature was then returned to a normal temperature. As a result, the film was contracted by 300 µm compared with the length before washing. This film was stored at a constant temperature and humidity, three days were required until the length gets stabilized. If the length dimension of the film is so extensively changed as just discussed, a difficulty is accompanied with not only the positional alignment at the time of manufacture of the ITO and color filter layers but also the positional alignment between the ITO and a driver circuit.

SUMMARY OF THE INVENTION

It is, therefore, an object of the present invention to provide a transfer body and various methods such as a method for reproducing the transfer body, a method for forming a transparent conductive layer using the transfer body, and the like, which is capable of solving the above-mentioned problems.

According to a first aspect of the present invention, there is provided a transfer body including at least a peelable layer, a transparent conductive layer and an adhesive layer all sequentially laminated on a heat-resisting and rigid supporting body, wherein the peelable layer is formed to have a pull strength of 100 g/cm or more. The heat-resisting property possessed by the supporting body must be large enough to withstand the heat treatment to the various layers on the supporting body and the rigidity possessed by the supporting body must be larger than that of the opponent member to which the layers on the supporting body are to be transferred.

According to a second aspect of the present invention, there is provided a method for reproducing a transfer body, the method comprising, at the time of reproducing a color filter layer formed on a transfer body, the steps of removing a color filter layer from a supporting body by a plasma etching method in which oxygen is chiefly used or by a reactive ion etching method (RIE) and then sequentially forming at least a color filter layer and an adhesive layer on the supporting body.

According to a third aspect of the present invention, there is provided a method for forming a transparent conductive layer using a transfer body comprising the steps of forming a transfer body by sequentially laminating at least a peelable layer, a transparent conductive layer and an adhesive layer on a heat-resisting and rigid supporting body, adhesively sticking the transfer body to one surface of a film composed of plastic material through the adhesive layer, and peeling off the transfer body inclusive the peelable layer from the supporting body through the peelable layer, thereby transferring the transparent conductive layer to the film composed of plastic material, wherein the peelable layer has a pull strength of 100 g/cm or more.

According to a fourth aspect of the present invention, there is provided a method for forming a transparent conductive layer using a transfer body comprising the steps of forming a transfer body by sequentially laminating at least a peelable layer, a transparent conductive layer and an adhesive layer on a heat-resisting and rigid supporting body, adhesively sticking the transfer body to one surface of a film composed of plastic material through the adhesive layer, and peeling off the transfer body inclusive the peelable layer from the supporting body through the peelable layer, thereby transferring the transparent conductive layer to the film composed of plastic material, wherein one end portion of the film composed of plastic material is temporality fixed to a roll having a diameter of 50 mm or more and preferably 100 mm or more and thereafter the roll is substantially rollingly moved to peel off the transfer body inclusive the peelable layer from the supporting body through the peelable layer, thereby transferring the transparent conductive layer to the one surface of the film composed of plastic material.

The supporting body used in the present invention for supporting the transfer body has a heat resisting property having a thermal expansion coefficient of $1.5 \times 10^{-5}/°$ C. or less and has a rigidity not readily changed in dimension due to change of temperature. A suitable supporting body includes a blue plate glass (thermal expansion coefficient: 9 to $10 \times 10^{-6}/°$ C.). In the case where the transparent conductive layer and the color pixel pattern are fine pitched thereby making it difficult to align the transparent conductive layer with the color filter composed of such color pixels as Y, M, C or R, G, B, a low thermal expansion glass (4 to $5 \times 10^{-6}/°$ C. ) is preferably used.

The peelable layer used in the present invention is a resin material having a high heat-resisting property such as a polyimide resin. The peelable layer is required to have an adhesion of about several g/cm to 100 g/cm under the condition of 90 degrees peel-off between the peelable layer and the supporting body.

Although it is preferred that the adhesion is smaller from the view point of peeling off the transfer body from the supporting body so as to be transferred to the film, it is necessary for the peelable layer to have more than a certain degree of adhesion so that it can withstand such manufacturing processes as washing and etching which are required for shaping the transparent conductive layer into the form of a pattern. Moreover, the peelable layer is required to have a pull strength of 100 g/cm or more (per width of 1 cm). The reason will be described later.

The pull strength of the peelable layer can be increased by enlarging its thickness. It is also required for the peelable layer to have resisting properties to temperature at the time of forming the transparent conductive layer and to chemical (s) used at the time of patterning the transparent conductive layer. In addition, it is, of course, required for the peelable layer to have a favorable adhesion to the transparent conductive layer.

As the material of the peelable layer, polyimide is the best. By applying the polyimide to the supporting body so as to form a thickness of 1.3 µm or more and preferably 2 µm or more, the required pull strength can be obtained.

As the transparent conductive layer of the present invention, indium tin oxide (ITO), indium oxide, tin oxide or the like can be used. Among them, ITO is currently considered as a material capable of exhibiting the best physical properties.

When ITO is formed into a layer by such layer forming means such as sputtering, ion plating or the like and under the temperature condition of 150° C. or higher, there can be obtained a layer having a low electrical resisting property. Although a layer having a low electrical resisting property is difficult to obtain, ITO can also be formed into a layer by the sol-gel method. By patterning such obtained transparent conductive layer, a transparent electrode is formed. This patterning can be performed by the known process of photolithography. In the case the adhesion between the peelable layer and the supporting body is several g/cm or less by 90° peel test, the peelable layer is peeled off during the patterning process of the transparent conductive layer. Since a supporting body having a small expansion coefficient is used at that time, a patterning with an excellent dimensional precision can be obtained.

By disposing a barrier layer of an inorganic material composed of SiOx, SiN, $Al_2O_3$, or $TiO_2$ between the peelable layer and the transparent conductive layer, there can be provided the function for protecting the transparent conductive layer and for serving as a gas barrier after the transfer body is transferred to the film.

The inorganic barrier layer can be formed in such a manner as to have a thickness of 0.1 μm or less by a vacuum layer forming means such as a spattering method, an ion plating method or the like. Thereafter, an intermediate layer and a color filter layer may be formed in accordance with necessity.

As the intermediate layer, an acrylic or alkyd resin or an inorganic material such as SiOx can be used. It is also accepted that an inorganic material such as SiOx serving as the barrier layer also serves as the intermediate layer. Such an intermediate layer as just mentioned serves to ease the stress, particularly the stress caused by hardening contraction of the adhesive agent at the time of transfer by sandwiching the transparent conductive layer between the peelable layer and the intermediate layer, so that an occurrence of cracks to the transparent conductive layer is prevented. Furthermore, the intermediate layer serves to protect a color filter layer, where there is a provision of such a color filter, at the time of peeling off the peelable layer.

The color filter layer can be formed by a general method using a photolithography. At that time, since the color filter layer is formed on the supporting body of the type as mentioned above, no problem occurs to the positional alignment. Moreover, since the process for forming the color filter layer includes a wet process as in the process for forming the ITO, it is desirable to use a supporting member which is hardly varied in dimension which would otherwise be varied by temperature and humidity.

The transparent conductive layer and the color filter layer thus formed on the supporting body are transferred to a film composed of a plastic material. As the plastic material, polyether-sulfone, polycarbonate, or the like can be used. The film thickness of such a plastic material is 50 μm to 300 μm and preferably 100 μm to 200 μm.

The supporting body with such a transparent conductive layer as ITO formed thereon is stuck to the film composed of a plastic material through the adhesive layer and the adhesive layer is hardened. As the adhesive layer, a layer which is hardened at a normal temperature is preferable for the purpose of maintaining a dimensional precision and a photo-hardening type adhesive layer is particularly preferable.

The adhesive layer used in the present invention must be able to firmly adhere to the uppermost layer such as a color filter layer formed on the supporting body.

There are encountered with some problems when the film composed of a plastic material is peeled off the supporting body through the peelable layer. The problems reside in a fact that at least the peelable layer, the transparent conductive layer and the adhesive layer are transferred from the rigid supporting body to the film composed of a highly flexible plastic material.

That is to say, when the film composed of a plastic material is peeled off the rigid supporting body, the film must be peeled off in such a manner as to be somewhat warped (or bent). At that time, the transparent conductive layer can follow a warping motion to some extent. However, since the transparent conductive layer is an inorganic substance, it is hard and fragile and therefore, cracks are liable to occur when a force is applied thereto in the warping direction. For this reason, it is necessary to control the force applied in the warping direction when the film composed of a plastic material is peeled off the supporting body through the peelable layer.

This problem can be solved by using a roll. By using the roll, the transparent conductive layer is peeled off the supporting body along the circumference of the roll. At that time, the diameter of the roll is set to 50 mm or more and preferably 100 mm or more. By doing so, it can be prevented that an undue warping force is applied to the transparent conductive film so that no cracks occur to the transparent conductive layer.

However, it sometimes happens that when transferring from the rigid supporting body to the film composed of a flexible plastic material, the peelable layer and the transparent conductive layer are partly left remained on the supporting body instead of being totally transferred to the film, depending on the material and thickness of the peelable layer even in the case where a roll having a diameter of 100 mm or more is used for the peeling off operation. At that time, it was observed that the layers to be transferred were peeled off between the transparent conductive layer and the intermediate layer or between the intermediate layer and the adhesive layer which are supposed to have a larger adhesive property than the adhesion between the supporting body and the peelable layer.

Moreover, in the case where a layer composed of an inorganic hard material such as SiOx is formed as an intermediate layer before and after the transparent conductive layer, it was confirmed through an experiment that this phenomenon becomes more manifest.

In this phenomenon, the larger the pattern of the transparent conductive layer is (i.e., the larger the area of the transparent conductive layer is), there is a more possibility for such a layer to be left remained on the supporting body. Even after the transparent conductive layer is transferred to the film, when the layer is subjected to heat treatment or applied with a stress attributable to a high temperature and high humidity test, wrinkles occur in a perpendicular direction to the peeling-off direction. The cause is considered as follows. Since the transparent conductive layer is hard compared with the film composed of a plastic material, the transparent conductive film tends to resist the warping force at the time of peeling-off. Accordingly, in the case where the transparent conductive layer is in the form of a narrow stripe pattern, it is preferred that the roll is arranged in parallel to the mutually parallel patterns and the roll is rollingly moved across the patterns.

In the present invention, when the transfer body inclusive the transparent conductive layer is peeled off the rigid supporting body so as to be transferred to the film composed of a plastic material, the transfer body can be peeled off through the peelable layer (namely, from the interface between the supporting body and the peelable layer). Moreover, as a result of extensive study as to the method for preventing an occurrence of cracks to the transparent conductive layer, it became apparent through experiments that the occurrence of cracks can be prevented by increasing the film strength of the peelable layer.

Inherently, when the transfer body is peeled off the rigid supporting body in order to transfer at least the peelable layer the transparent layer and the adhesive layer to the film composed of a high flexible plastic material, the transfer body is adhesively stuck to the film and so the transfer body inclusive the peelable layer is integral with the film. Therefore, it seems that the transfer body can easily be peeled off through the peelable layer. However, as previously mentioned, by selecting the material of the peelable layer and properly controlling the thickness thereof and by increasing the strength of the peelable layer to the level as mentioned above, the transfer body can be peeled off not only by the adhesive force (adhesion) between the adjacent layers of at least the peelable layer, the transparent layer and the adhesive layer but also the transfer body can be peeled off in such a manner as to raise the transparent conductive layer over the peelable layer. In this way, by using a peelable layer having a predetermined pull strength, the transparent conductive layer can be transferred irrespective of the pattern shape of the transparent conductive layer and the material of the intermediate layer(s). Moreover, the transfer body can be transferred without undue stress applied to the transparent conductive layer. Consequently, wrinkles do not occur to the transparent conductive layer even if it is placed under a stress caused by the heat treatment or high temperature and high humidity test after the transfer body is transferred to the film. Thus, the transferred transparent conductive layer can be enhanced in resistance against heat and resistance against high temperature and high humidity. Although the strength required for the peelable layer affects the adhesion between the supporting body and the peelable layer, the hardness of the transparent conductive layer and the area (shape) of the pattern of the transparent conductive layer, the adhesion between the supporting body and the peelable layer must be restrained in a certain range in consideration of the following process for forming the various layers as previously mentioned. Also, the hardness of the transparent conductive layer must be restrained in a certain range, though there are some differences depending on the method for forming layers, etc. Particularly, in the case where the transparent conductive layer is used as a stripe electrode for LCD, it is important that a transparent conductive layer having a line width of about 100 μm can be transferred. The strength required for the peelable layer at that time is 100 g/cm. In the case of a product including a pattern having a larger line width and a wider area, the strength required for the peelable layer is 150 g/cm.

In the case where the peelable layer is formed to have such a thin layer width as 100 nm as disclosed in Japanese Patent Application Laid-Open No. H11-24081, it is practically impossible to transfer the layer of ITO, etc. formed on the rigid supporting body to a flexible film composed of plastic material or the like. In case of such a thin peelable layer, a peeling interface can be determined solely by how strong or how weak the adhesive force (adhesion) between the layers is. The reason is that since the rigidity of the supporting body and the ITO is stronger than the rigidity of the film and the adhesive agent, the area which is subjected to force at the time of transfer becomes larger than other interface and as a result, the ITO is left remained on the supporting body.

The peelable layer composed of a resin material is left remained on the uppermost layer at the time of transfer of the transparent conductive layer to the film composed of a plastic material. In the case where the transparent conductive layer is used particularly as an electrode for LCD or the like, it is necessary to remove the peelable layer in order to facilitate a smooth driving of the crystal. As a method for removing the peelable layer composed of a polyimide resin, there is a method for removing it using a specific solution such as a mixed solution of hydrazine and ethylene diamine, and an alkaline solution. Since there is a possibility that an adverse effect is prevailed on the adhesive force (adhesion) between the layers due to permeation of the solution from end portions, for example, of the transparent conductive layer, the adhesive layer and the film, it is desirable to remove the peelable layer by suitable method such as a plasma etching method in which oxygen is chiefly used and a reactive ion etching method. However, in the case where the thickness of the peelable layer is increased, the surface smoothness is deteriorated when coated and it becomes extremely difficult to remove the peelable layer. For example, at the time of removing the peelable layer, the adverse effect of the irregular etching is increased and there appears a region which is overly subjected to the etching liquid or etching gas. This tends to give damages to the underground layer(s). Although it is technically possible to remove the peelable layer until it has a thickness of about 20 μm without giving damages to the underground layer(s), the thickness of the peelable layer is preferably 10 μm or less in consideration of the production tact.

In the case where the peelable layer is removed using the plasma etching method in which oxygen is chiefly used, it is preferred that a barrier layer composed of SiOx having a thickness of 0.1 μm or less is disposed between the peelable layer and the transparent conductive layer or an intermediate layer is composed of a material having a resistance against plasma gas and such obtained intermediate layer commonly serves as the barrier layer.

The barrier layer acts as an etching stopper at the time of removal of the peelable layer by etching. In order to clearly understand the terminal point (namely, the timing for ending the etching operation), it is preferred that the peelable layer itself is composed of a colored resin instead of composing the peelable layer from a colorless resin. As a colored resin, aromatic polyimide resins which are originally yellow-colored in the respect of a molecular structure, or those resins which are colored by applying a dye or pigment to a transparent resin can be used. Specific examples of the latter include, as resins, acryl, epoxy and polyimide of a particular structure (which is obtained by adding a silane coupling agent to polyimide synthesized from pyromellitic anhydride and 4,4'-diaminodiphenyl ether), as dyes, C.I. solvent, yellow 63, C.I. solvent blue 25 and acid rhodamine, and as pigments, C.I. pigment blue and C.I. pigment yellow 139. The coloring concentrations of them are preferably 2 to 4 μm in thickness and their minimum penetration factors are about 5 to 60%.

When a layer having a resistance against a plasma gas is formed on the supporting body at the time of forming the transfer body, it can sometimes happen that the color filter layer gets an defect, that cannot be corrected, in hue or other parts at a stage where the formation of the layers has been completed up to the color filter layer. In that case, the transfer body can be reproduced by removing only the color filter layer by a suitable method such as a plasma etching method in which oxygen is chiefly used. By adding a small quantity of gas such as CF4 to the oxygen, the etching can be made quickly compared with the case in which only oxygen is used. However, there is a risk that CF4 attacks SiOx and ITO itself. Therefore, by arranging such that the etching is made using oxygen added with CF4 at an early stage of the etching and the gas to be used is gradually changed to a pure oxygen as the etching process comes closer to the end, there can be obtained an etching which is damageless to the underground layer(s).

Since the removal of the peelable layer and the reproduction of the transfer body are performed by a dry process such as a plasma etching in which oxygen is chiefly used, the method of the present invention has such an advantage that there is no need of discarding exhaust liquid which would otherwise be necessitated as in the conventional method using a solution. Thus, there can be free from the problem for causing an environmental pollution, etc. The barrier layer composed of SiOx have functions serving as an insulating film for the transparent conductive layer placed opposite thereto after panelized and as a protective layer for the transparent conductive layer itself. It further have the functions to improve the gas barrier performance and improve the adhesion between the transparent conductive layer and the color filter layer.

DETAILED DESCRIPTION OF THE EMBODIMENTS

The pull strength and peelability of a peelable layer and removal of the peelable layer will now be described.

Embodiment 1

Figure 1:
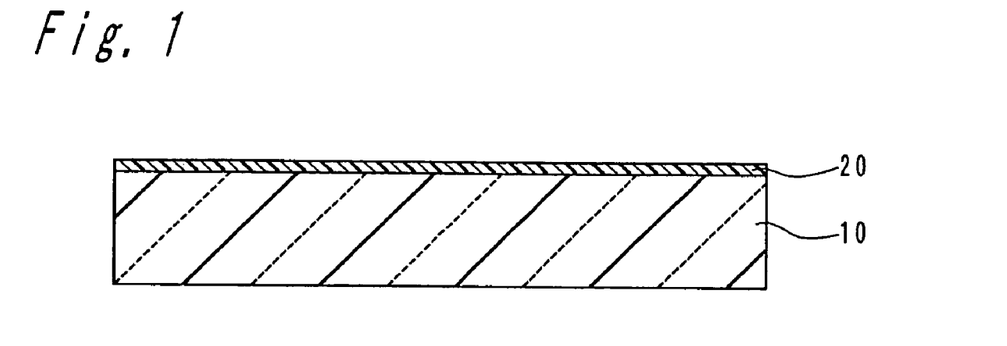
FIG. 1 is a schematic view showing a stage wherein a peelable layer has been formed on a supporting body.

0.05 wt % (solid portion ratio) of silane coupling agent KBM-573 (manufactured by Shinetsu Silicone Co., Ltd.) was added to a polyimide precursor vanish (dimethylacetamide solution, solid portion ratio 10%) obtained by reacting a pyromellitic anhydride with 4,4' diaminodiphenyl ether to prepare a silica-coated blue plate glass substrate as the supporting body 10. Then, a coating layer was formed on the substrate 10 using a spin coater under the conditions of 900 rpm, 12 seconds. After drying, the resultant was heated for 10 minutes while keeping a high temperature of 260° C. using a hot plate and subjected to dehydrating ring-closing treatment. By doing so, a peelable layer 20 composed of polyimide having a thickness of 2 μm was formed (FIG. 1).

The adhesion strength of the interface between the peelable layer 20 and the supporting body 10 was 4 g/cm at two days after the heating treatment. The pull strength of the peelable layer was measured by tests carried out applying ISO 527-3. The measured value was 150 g/cm.

Figure 2:
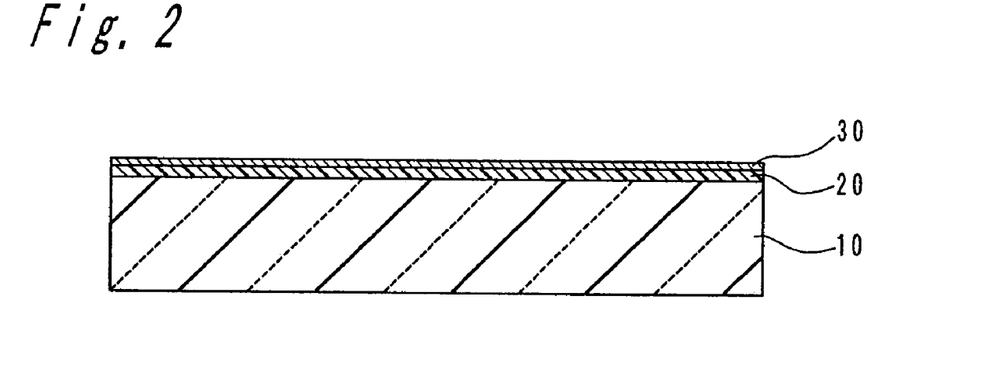
FIG. 2 is likewise a schematic view showing another stage wherein a transparent conductive layer has been formed on the peelable layer.
Figure 3:
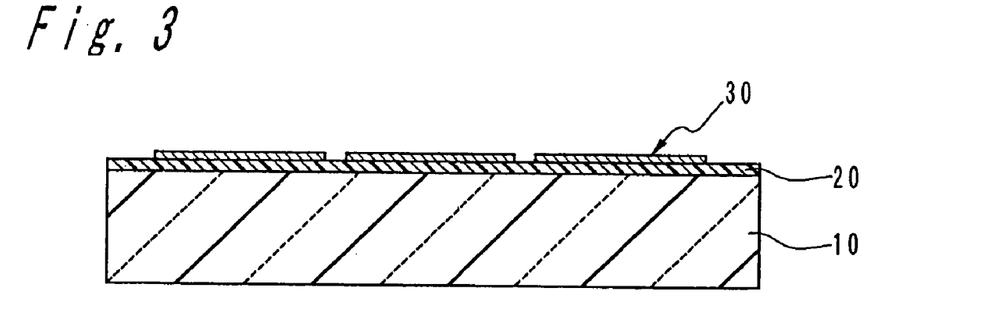
FIG. 3 is likewise a schematic view showing a further stage wherein the transparent conductive layer has been patterned.
Figure 4:
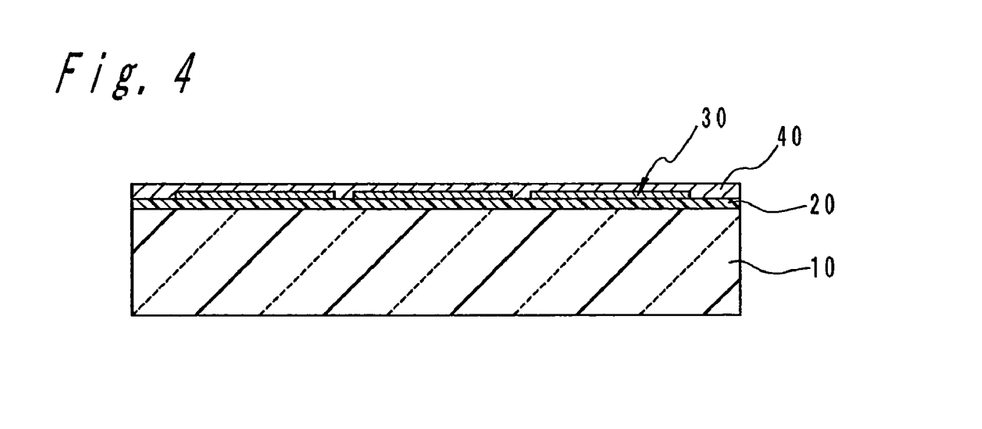
FIG. 4 is likewise a schematic view showing a still further stage wherein an intermediate layer has been formed.

Then, a transparent conductive layer 30 having 1500Å (angstrom) and composed of ITO was formed on the peelable layer 10 at a substrate temperature of 180° C. by a spattering method. Its surface electrical resistance was 15Ω/□ (FIG. 2). Then, a commercially available positive resist was applied to the transparent conductive layer 30. After dried, the resultant was exposed to light through a mask having a prescribed pattern, developed and etched to peel off the resist. By doing so the transparent layer 30 was patterned (FIG. 3). An intermediate layer 40 of 0.7 μm was formed on the patterned transparent conductive layer 30 using a silica-based coating agent ZRS-5PH-3 (Shokubai Kasei K. K.) (FIG. 4).

Figure 5:
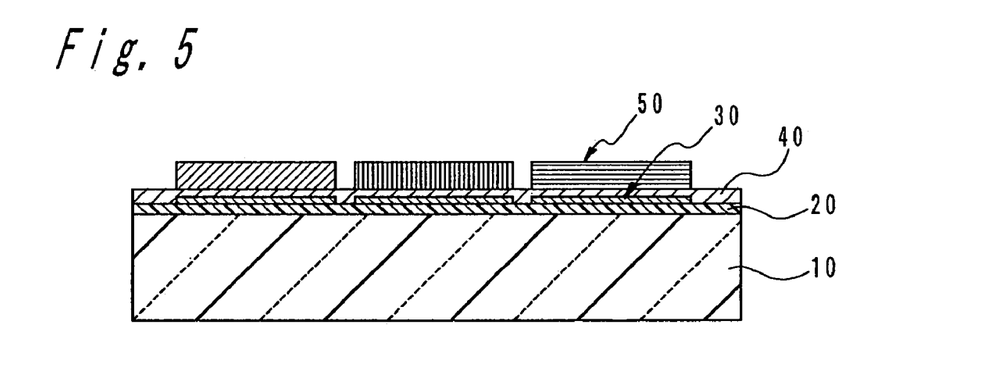
FIG. 5 is likewise a schematic view showing a yet further stage wherein a color filter layer has been formed.
Figure 6:
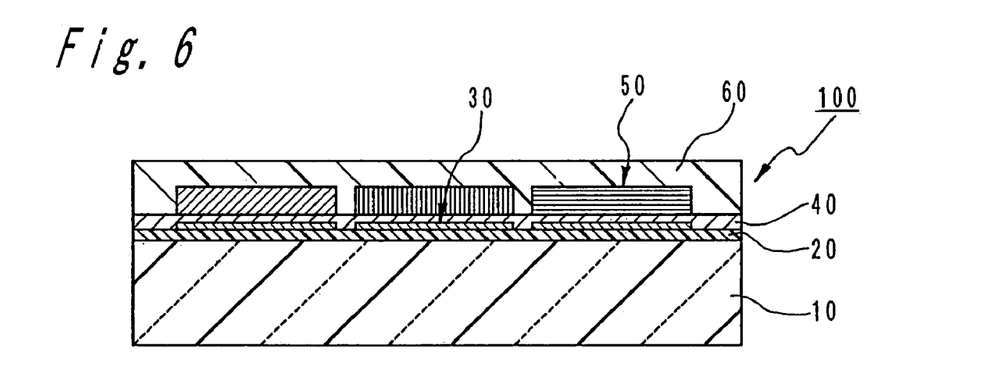
FIG. 6 is likewise a schematic view showing an additional stage wherein an adhesive layer has been formed.

Thereafter, a color filter layer 50 was formed on the intermediate layer 40 by the process of photolithography using a colored polyimide (FIG. 5) and then, an ultraviolet-curing type adhesive agent KR-400 (manufactured by Asahi Kasei K. K.) was formed on the color filter layer 50 as the adhesive layer 60 such that its thickness was about 8 μm. By doing so, a first transfer body 100 was formed (FIG. 6).

Figure 7:
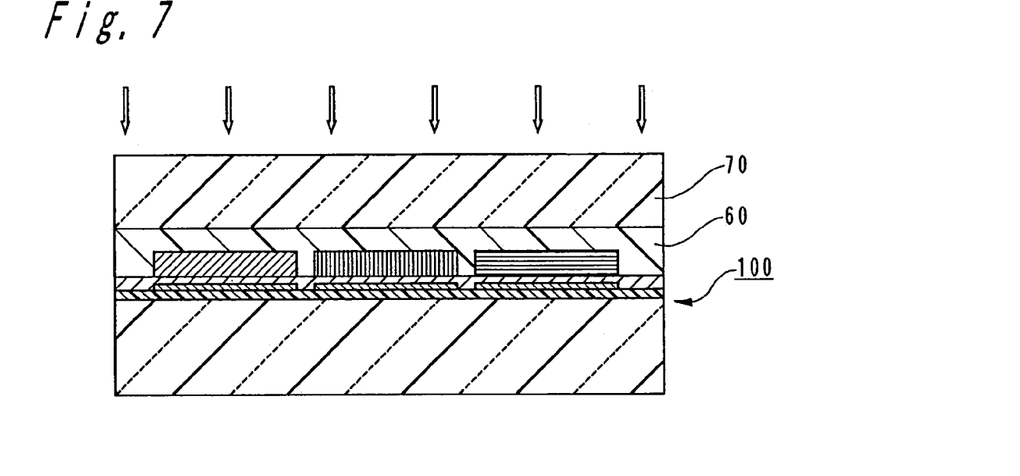
FIG. 7 is a schematic view showing a stage wherein the transfer body supported on the supporting member is to be transferred to an opponent member (plastic film)

Subsequently, this transfer body 100 was stuck to a film 70 composed of a plastic material (polyester sulfone resin (manufactured by Sumitomo Bakelite K. K.)) having a thickness of 150 μm through the adhesive agent 60 and the adhesive agent 60 was cured by irradiating an ultraviolet ray (FIG. 7).

Figure 8:
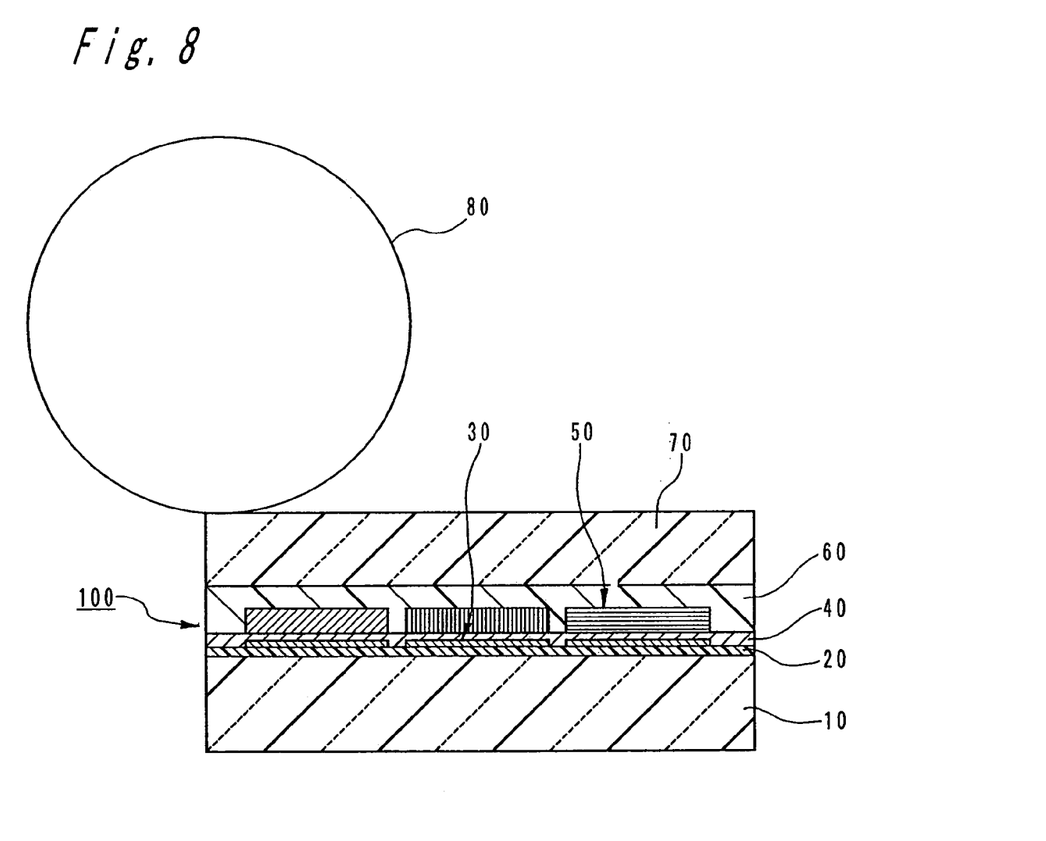
FIG. 8 is likewise a schematic view, according to another embodiment, showing a stage wherein a transfer body supported on a supporting member is to be transferred to an opponent member (plastic film)
Figure 10:
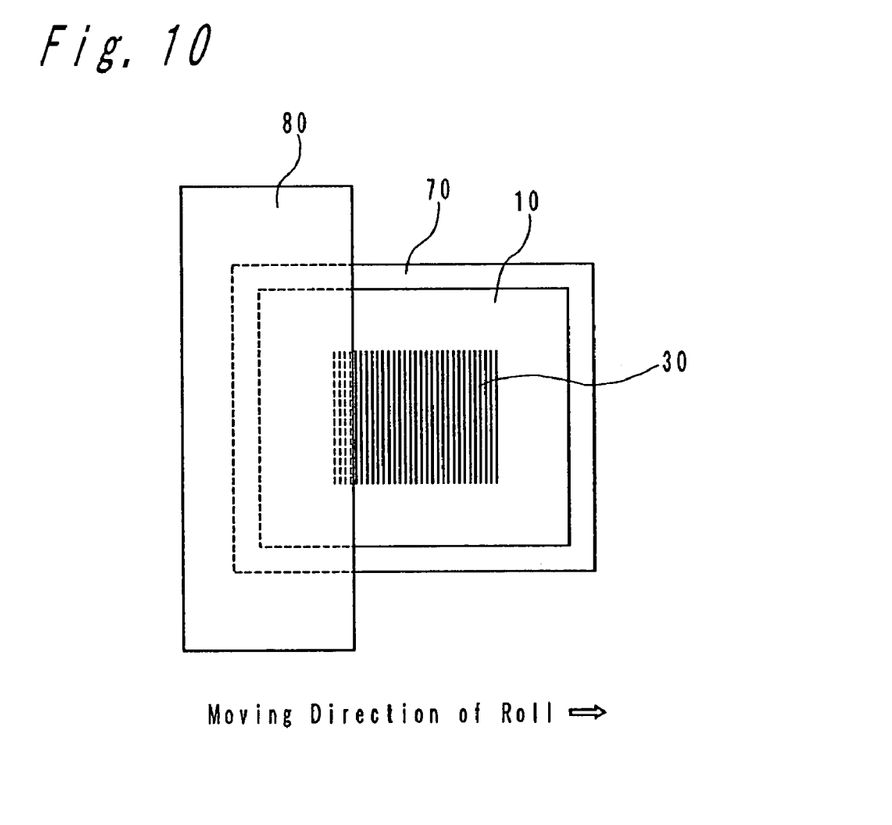
FIG. 10 is a top plan view of FIG. 8, showing a stage wherein the transfer body is to be transferred to the opponent member.

Thereafter, one end of the film 70 stuck to the transfer body 100 was fixed to a roll 80 having a diameter of 200 mm and the film 70 was peeled off the transfer body 100 while rollingly moving the roll 80 (FIG. 8). At that time, the transfer body 100 was peeled off the supporting body 10 through the peelable layer 20, and the transparent conductive layer 30, the color filter layer 50, etc. were transferred to the film 70. Even in the case where the transferred transparent conductive layer 30, etc. were subjected to stress caused by heat treatment or high temperature and high humidity test or the like, no wrinkles occurred to the transparent conductive layer 30. As previously mentioned, in the case where the transparent conductive layer 30 is in the form of a stripe pattern, it is preferred that the transparent conductive layer 30 is peeled off in the state in which the axis of the roll 80 is in parallel to the pattern of the transparent conductive layer 30 as shown in FIG. 10.

Figure 9:
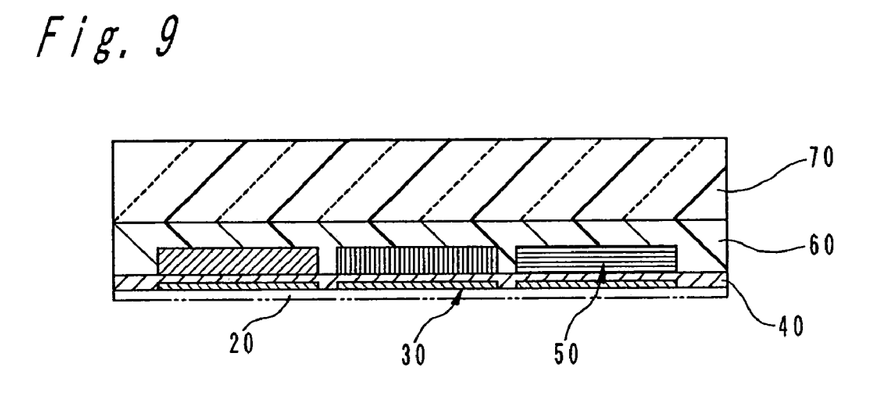
FIG. 9 is a schematic view showing a stage wherein the transfer body has been transferred to the opponent member.

Then, the transfer body on the film 70 was subjected to oxygen plasma etching treatment using a V1000 multi-stage test machine (manufactured by Mori Engineering K. K.) under the conditions of 400 sccm of a gas flow rate, 86 Pa of a degree of vacuum, 500 W of an RF output and 25° C. of atmosphere (temperature), and the peelable layer 20 was removed from the film 70 after about 15 minutes (FIG. 9). No problems occurred to the ITO which was placed adjacent to the peelable layer 20.

Embodiment 2

A peelable layer having a thickness of 4 μm was formed on a supporting body (silica-coated blue plate glass) using the same material as in the Embodiment 1. The pull strength of this peelable layer was 300 g/cm.

Thereafter, the remaining layers were formed under the same conditions as in the Embodiment 1 only except that an intermediate layer having a thickness of 1.5 μm was formed using a coating agent EXP-1474 (manufactured by Fujikura Kasei K. K.). By doing so, a second transfer body was formed.

Such obtained second transfer body was transferred to a film under the same conditions as in the Embodiment 1 and peeled off along the roll under the same conditions as in the Embodiment 1. The transfer body was peeled off the supporting body through the peelable layer, and the transparent conductive layer, the color filter layer, etc. were transferred to the film. Even in the case where the transferred transparent conductive layer, etc. were subjected to stress caused by heat treatment or high temperature and high humidity test or the like, no wrinkles occurred to the transparent conductive layer.

Thereafter, the peelable layer was removed by dipping the film in a mixed solution of hydrazine and ethylenediamine in a mixing ratio of 1:1 for 11 minutes and the film was washed in water. Then, the film was heated at 100° C. and dried. No problems occurred to the film in particular.

Embodiment 3

Various layers were formed under the same conditions as in the Embodiment 1 only except that an intermediate layer having a thickness of 2 μm was formed using a coating agent Optmer SS-6917 (manufactured by JSR K. K.). By doing so, a third transfer body was formed. Such obtained third transfer body was transferred to a film under the same conditions as in the Embodiment 1 and peeled off along the roll under the same conditions as in the Embodiment 1. The transfer body was peeled off the supporting body through the peelable layer, and the transparent conductive layer, the color filter layer, etc. were transferred to the film. Even in the case where the transferred transparent conductive layer, etc. were subjected to stress caused by heat treatment or high temperature and high humidity test or the like, no wrinkles occurred to the transparent conductive layer.

Then, the film was dipped in a heated aqueous solution of 5% of NaOH so as to be swollen and removed. Thereafter, the film was washed in water. Then, the film was heated at 140° C. and dried. No problems occurred to the film at all. Even after storage of a long time period under the conditions of 40° C. and 90%, no problems occurred to the film at all.

Embodiment 4

Various layers were formed under the same conditions as in the Embodiment 1 only except that ITO serving as a transparent conductive layer was formed by a vacuum vapor-deposition method at a substrate temperature of 300° C. such that the transparent conductive layer had a thickness of 1500 angstrom (surface electrical resistance of 20 Ω/□). By doing so, a fourth transfer body was formed. Such obtained third transfer body was transferred to a film and the peelable layer was removed under the same conditions as in the Embodiment 1. No problems have occurred.

Comparative Embodiment 1

A peelable layer having a thickness of 1 μm was formed on a supporting body (silica-coated blue plate glass) using the same material as in the Embodiment 1. The pull strength of the peelable layer was 75 g/cm. Thereafter, various layers were formed under the same conditions as in the Embodiment 1. By doing so, a transfer body e was formed. Such obtained transfer body e was transferred to a film under the same conditions as in the Embodiment 1 and peeled off along the roll under the same conditions as in the Embodiment 1. That region of the transfer body where the transparent conductive layer exists was mostly left remained on the supporting body and the transfer body was peeled off through an interface between an intermediate layer and a color filter or through an interface between the color filter layer and an adhesive layer.

In order to evaluate the adhesion between the intermediate layer and the color filter layer or between the color filter and the adhesive layer, those layers were individually formed on a glass or the like. They were not peeled off by a cross-cut test performed following the protocol set out in ISO 2409 (1992).

Comparative Embodiment 2

Various layers were formed under the same conditions as in the Embodiment 2 only except that a peelable layer was formed in the same condition as in the Comparative Embodiment 1. By doing so, a transfer body f was obtained. Such obtained transfer body f was transferred to a film under the same conditions as in the Embodiment 1 and peeled off along the roll under the same conditions as in the Embodiment 1. Although that region of a transparent conductive layer which has a line width of 100 μm was transferred, other region having a line width of 1 mm or more was left remained on the supporting body. When the transferred film was heated at a temperature of 100° C., wrinkles were generated to the transparent conductive layer perpendicular to the peeling direction (parallel direction to the roller at the time of peeling off). Moreover, when the transferred film was left as it is for a long time under the conditions of 40° C. and 90%, wrinkles occurred heavily and cracks were also occurred.

Comparative Embodiment 3

Various layers were formed under the same conditions as in the Embodiment 3 only except that a peelable layer was formed under the same condition as in the Comparative Embodiment 1. By doing so, a transfer body g was obtained.

Such obtained transfer body g was transferred to a film under the same conditions as in the Embodiment 1 and peeled off along a roll under the same conditions as in the Embodiment 1. Although that region of the transfer body where the line width of a transparent conductive layer was 100 μm was transferred, other region having the line width of 1 mm was left remained on the supporting body.

Comparative Embodiment 4

Various layers were formed under the same conditions as in the Embodiment 4 only except that a peelable layer was formed under the same conditions as in the Comparative Embodiment 1. By doing so, a transfer body h was obtained. Such obtained transfer body h was transferred to a film under the same conditions as in the Embodiment 1 and peeled off along a roll under the same conditions as in the Embodiment 1. A transparent conductive layer was mostly left remained on the supporting body.

Test Example 1 for Confirming Critical Meaning of Numerical Values

A peelable layer having a thickness of 1.5 μm was formed on a supporting body (silica-coated blue plate glass) using the same material as in the Embodiment 1. The pull strength of this peelable layer was 110 g/cm. Thereafter, various layers were formed under the same conditions as in the Embodiment 1. By doing so, a transfer body was obtained. Such obtained transfer body was transferred to a film under the same conditions as in the Embodiment 1 and peeled off along a roll under the same conditions as in the Embodiment 1. When the transferring state of the transparent conductive layer including different line widths was observed, that region of the transfer body having the line width of 100 μm was transferred but other region having the line width of 1 mm or more was left remained on the supporting body.

Test Example 2 for Confirming Critical Meaning of Numerical Values

A peelable layer was formed under the same conditions as in the Test Example 1 and other layers were formed under the same conditions as in the Embodiment 2. By doing so, a transfer body was obtained. Such obtained transfer body was transferred to a film under the same conditions as in the Embodiment 1 and peeled off along a roll under the same conditions as in the Embodiment 1. Although the transparent conductive layer had different line widths, it was effectively transferred to the film.

Test Example 3 for Confirming Critical Meaning of Numerical Values

A peelable layer was formed under the same conditions as in the Test Example 1 and other layers were formed under the same conditions as in the Embodiment 3. By doing so, a transfer body was obtained. Such obtained transfer body was transferred to a film under the same conditions as in the Embodiment 1 and peeled off along a roll under the same conditions as in the Embodiment 1. Although the transparent conductive layer bad different line widths, it was effectively transferred to the film.

Test Example 4 for Confirming Critical Meaning of Numerical Values

A peelable layer was formed under the same conditions as in the Test Example 1 and other layers were formed under the same conditions as in the Embodiment 4. By doing so, a transfer body was obtained. Such obtained transfer body was transferred to a film under the same conditions as in the Embodiment 1 and peeled off along a roll under the same conditions as in the Embodiment 1. Although that region of the transparent conductive layer having a line width of 100 μm was transferred to the film, other region having a line width of 1 mm or more was left remained on the supporting body.

In the embodiments to follow, a method for reproducing a body to be supported will be described.

Embodiment 5

Each of color pixels of Y, M and C was formed by a photolithography process using colored polyimide under the same conditions as in the Embodiment 1, so that each color pixel has a thickness of 0.7 μm and various layers were formed up to a color filter layer 50 (FIGS. 1 to 4). However, because inconveniences have occurred to part of the color pixels such as a speckled pattern, the color filter layer 50 was subjected to oxygen plasma etching treatment using a V1000 multi-stage test machine (manufactured by Mori Engineering K. K.) under the conditions of a gas flow rate of 400 sccm, a vacuum degree of 86 Pa, an RF output of 500 W and in the atmosphere (temperature) of 25° C. and the color filter layer was removed after five minutes. The color filter layer 50 was totally removed and no problems occurred to the silica-based intermediate layer 40.

Then, each of the color pixels of Y, M and C was formed on an intermediate layer 40 once again by a photolithography process using colored polyimide so that each color pixel has a thickness of about 0.7 μm. By doing so, the color filter layer 50 was reproduced (FIG. 5).

Subsequently, an ultraviolet-curing type adhesive agent KR-400 (manufactured by Asahi Denka K. K.) was coated on the color filter layer 50 as an adhesive layer 60 such that the adhesive layer 60 has a thickness of about 8 μm. By doing so, a transfer body 100 was formed (FIG. 6).

Embodiment 6

Figure 11:
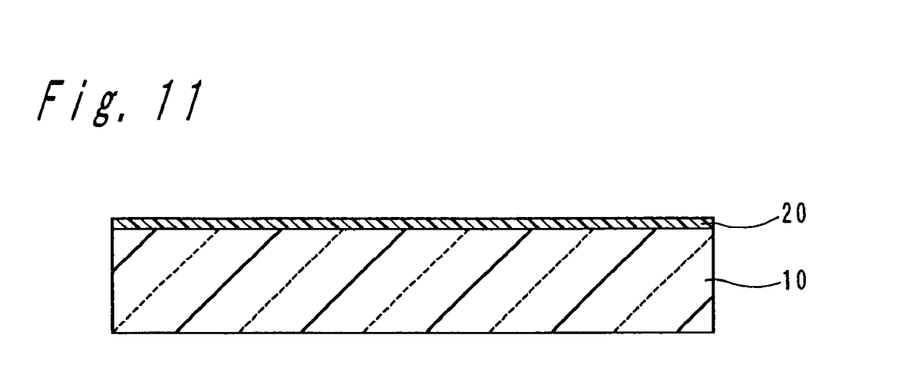
FIG. 11 is a schematic view showing another stage wherein a peelable layer has been formed on the supporting body.
Figure 12:
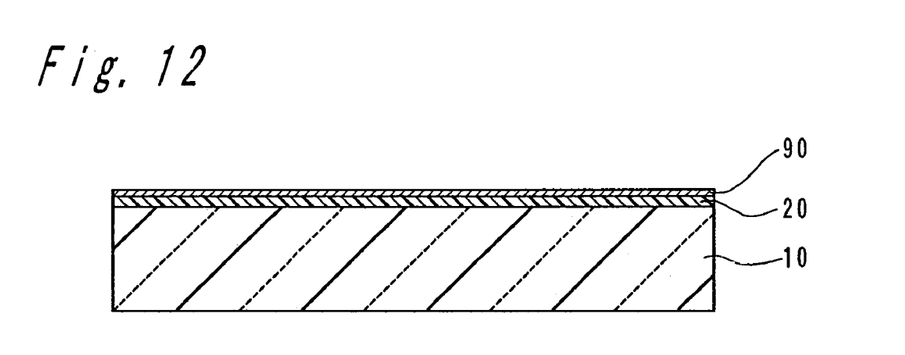
FIG. 12 is likewise a schematic view showing a further stage wherein a barrier layer has been formed on the peelable layer.

A peelable layer 20 is formed on a supporting body 10 under the same conditions as in the Embodiment 1 (FIG. 11). Then, a barrier layer 90 of 100 angstrom was formed on peelable layer 20 by a spattering method at a substrate temperature of 180° C. using $SiO_2$ (FIG. 12).

Figure 13:
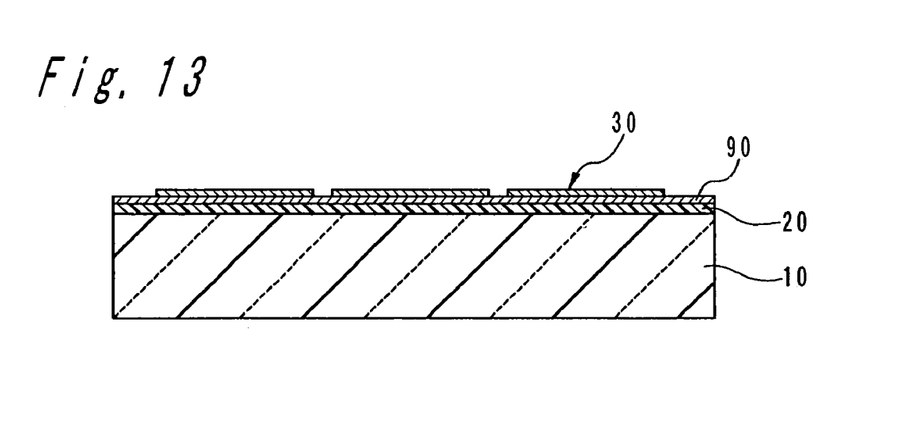
FIG. 13 is likewise a schematic view showing a still further stage wherein a transparent conductive layer has been patterned.

Then, a transparent conductive layer 30 of 1500 angstrom was formed on the barrier layer 90 by the spattering method at a substrate temperature of 180° C. using ITO. The surface electrical resistance thereof was 15 Ω/□. Subsequently, a commercially available positive resist was applied to the transparent conductive layer 30. After dried, the resultant was exposed to light through a mask having a prescribed pattern, developed and etched to peel off the resist. By doing so the transparent layer 30 was patterned (FIG. 13).

Figure 14:
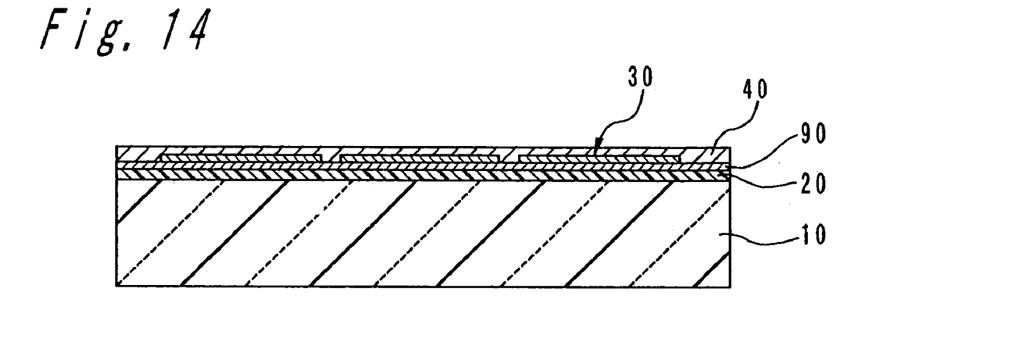
FIG. 14 is likewise a schematic view showing a yet further stage wherein an intermediate layer has been formed.

Then, an intermediate layer 40 having a thickness of 1.5 μm was formed using a coating agent EXP-1474 (manufactured by Fujikura Kasei K. K.) of an alkyd resin (FIG. 14).

Figure 15:
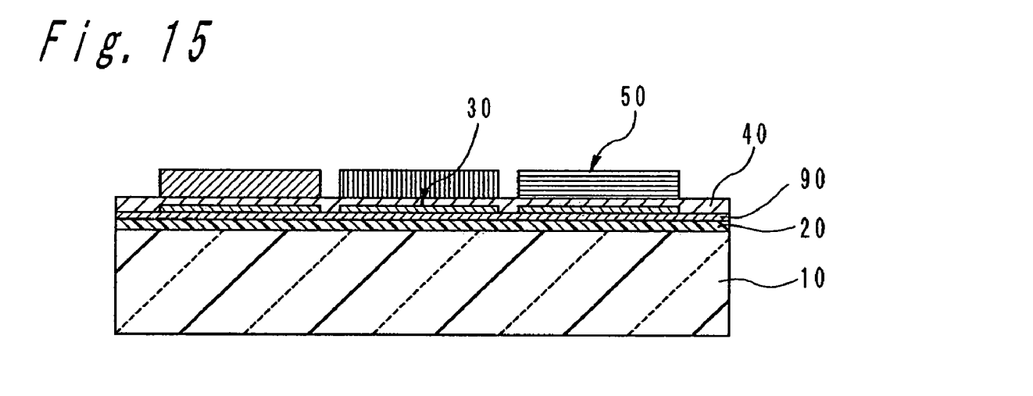
FIG. 15 is likewise a schematic view showing an additional stage wherein a color filter layer has been formed.

Then, each of color pixels of Y, M and C was formed on the intermediate layer 40 by a photolithography process using colored polyimide, so that each color pixel has a thickness of about 0.7 μm. By doing so, a color filter layer 50 was formed (FIG. 15). However, because inconveniences have occurred to part of the color pixels, the color filter layer 50 was subjected to oxygen plasma etching treatment using a V1000 multi-stage test machine (manufactured by Mori Engineering K. K.) under the conditions of a gas flow rate of 400 sccm, a vacuum degree of 86 Pa, an RF output of 500 W and in the atmosphere (temperature) of 25° C. and the intermediate layer 40 and the color filter layer 50 were removed after about ten minutes. The intermediate layer 40 and the color filter layer 50 were totally removed and no problems occurred to the barrier layer 90.

Then, as previously mentioned, the intermediate layer 40 and the color filter layer 50 were reproduced on the barrier layer 90 (FIG. 15).

Figure 16:
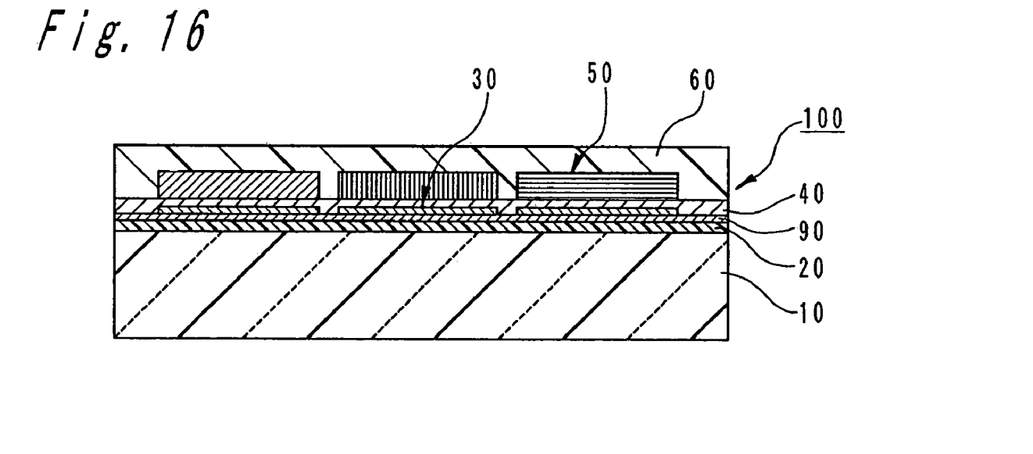
FIG. 16 is likewise a schematic view showing a final stage wherein an adhesive layer has been formed.

Then, an ultraviolet-curing type adhesive agent KR-400 (manufactured by Asahi Denka K. K.) was coated on the color filter layer 50 as an adhesive layer 60 such that the adhesive layer 60 has a thickness of about 8 µm. By doing so, a transfer body 100 was formed (FIG. 16).

As described hereinbefore, since the transparent conductive layer and the color filter layer are formed on a rigid supporting body, the positional alignment between the transparent conductive layer and the color filter layer is easy. Since the photolithography process is used, there can be provided a highly fine color filter. Moreover, it is no more required to pay attention to the contraction of the plastic sheet which would otherwise occur at the time of reproducing the transparent conductive layer and the color filter layer which has been once formed on the heat-resisting plastic sheet, once again on the plastic sheet through an adhesive agent as in the conventional method. Moreover, by virtue of a provision of the intermediate layer composed of an inorganic material such as SiOx, SiN, $Al_2O_3$, or $TiO_2$, the transfer body can be reproduced and no adverse effect is prevailed on the transparent conductive layer at the time of removal of the peelable layer.

The present invention can provide a transfer body, a method for reproducing the transfer body, a method for forming a transparent conductive layer using the transfer body, and a method for manufacturing a color filter using them, which are capable of solving the problems inherent in the conventional techniques.

What is claimed is:

1. A method for forming a transparent conductive layer using a transfer body comprising the steps of:

forming a transfer body by sequentially laminating at least a peelable layer, a transparent conductive layer and an adhesive layer on a supporting body having a heat resisting property enough to withstand heat treatment to said layers on said supporting body and a large rigidity compared with an opponent member to which said layers are to be transferred;

adhesively sticking said transfer body to one surface of a film composed of plastic material through said adhesive layer; and peeling off said transfer body inclusive said peelable layer from said supporting body through said peelable layer, thereby transferring said transparent conductive layer to said film composed of plastic material;

wherein said peelable layer has a pull strength of 100 g/cm or more.

2. A method for forming a transparent conductive layer using a transfer body according to claim 1, wherein said transparent conductive layer is in the form of a pattern.

3. A method for forming a transparent conductive layer using a transfer body according to claim 1, wherein an intermediate layer is disposed between said transparent conductive layer and said adhesive layer.

4. A method for forming a transparent conductive layer using a transfer body according to claim 3, wherein a color filter is formed between said transparent conductive layer and said intermediate layer, or between said intermediate layer and said adhesive layer.

5. A method for forming a transparent conductive layer using a transfer body according to claim 1, wherein one end portion of said film composed of plastic material is temporality fixed to a roll having a diameter of 100 mm or more and thereafter said roll is substantially rollingly moved to peel off said transfer body inclusive said peelable layer from said supporting body through said peelable layer, thereby transferring said transparent conductive layer to the one surface of said film composed of plastic material.

6. A method for forming a transparent conductive layer using a transfer body according to claim 1, wherein a barrier layer composed of inorganic material is disposed between said peelable layer and said transparent conductive layer and/or between said transparent conductive layer and a color filter layer.

7. A method for forming a transparent conductive layer using a transfer body according to claim 6, wherein said transparent conductive layer is transferred to the one surface of said film composed of plastic material and thereafter removing said peelable layer by a plasma etching method or reactive ion etching method (RIE) in which oxygen is chiefly used.

8. A method for forming a transparent conductive layer using a transfer body according to claim 1, wherein said peelable layer is a polyimide resin having a thickness of 2 µm or more.

9. A method for forming a transparent conductive layer using a transfer body according to claim 1, wherein said peelable layer is composed of a colored resin, thereby enabling to recognize a terminal point at the time of removal of said peelable layer.

10. A method for forming a transparent conductive layer using a transfer body according to claim 1, wherein said peelable layer is a polyimide resin having a thickness of 1.3 µm or more or more.

11. A method for forming a transparent conductive layer using a transfer body according to claim 1, wherein one end portion of said film composed of plastic material is temporality fixed to a roll having a diameter of 50 mm or more and thereafter said roll is substantially rollingly moved to peel off said transfer body inclusive said peelable layer from said supporting body through said peelable layer, thereby transferring said transparent conductive layer to the one surface of said film composed of plastic material.

* * * * *